US007202094B2

(12) United States Patent
DiBiase

(10) Patent No.: US 7,202,094 B2
(45) **Date of Patent: *Apr. 10, 2007**

(54) PROCESS FOR LOCATING, DISPLAYING, ANALYZING, AND OPTIONALLY MONITORING POTENTIAL TRANSIENT DEFECT SITES IN ONE OR MORE INTEGRATED CIRCUIT CHIPS OF A SEMICONDUCTOR SUBSTRATE

(75) Inventor: Tony DiBiase, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/245,291

(22) Filed: Oct. 5, 2005

(65) Prior Publication Data

US 2006/0030061 A1 Feb. 9, 2006

Related U.S. Application Data

(62) Division of application No. 10/199,552, filed on Jul. 18, 2002, now Pat. No. 6,977,183.

(51) Int. Cl.
*H01L 21/66* (2006.01)

(52) U.S. Cl. ............................................ 438/7; 438/16

(58) Field of Classification Search ..................... 438/7
See application file for complete search history.

(56) References Cited

U.S. PATENT DOCUMENTS 5,943,551 A 8/1999 Schemmel et al. ........... 438/14

(Continued)

FOREIGN PATENT DOCUMENTS

JP 2003-068815 7/2003

OTHER PUBLICATIONS

Almog et al., "Size Matters: Defect Detectability in Reticle and Wafer Inspection Including Advanced Aerial Image Simulation for Defect Printability", Proc. of SPIE, vol. 3546, pp. 139-144, 1998.

(Continued)

*Primary Examiner*—Stephen W. Smoot
(74) *Attorney, Agent, or Firm*—John P. Taylor

(57) ABSTRACT

A process which addresses the problem of transient defects comprises first processing one or more test chips on a substrate to reveal one or more potential transient defects during subsequent processing of all of the chips on the substrate; identifying the exact locations of such potential transient defects on one or more chips of a silicon substrate; forming a file containing the coordinates of each potential transient defect on the chip; converting the file into a CAD image layer capable of displaying such potential transient defects; and displaying such potential transient defects superimposed over a CAD image of the actual circuit to permit visual inspection of the compound CAD image and to permit optional action to be taken in view of such potential transient defects. In another embodiment of the invention, the file containing the locations of the potential transient defects is transmitted to a metrology apparatus such as a critical dimension (CD) scanning electron microscope (SEM) which monitors the potential transient defect addresses during processing of the chip. The two embodiments of the invention may be practiced in the alternative or in combination with one another.

10 Claims, 7 Drawing Sheets

PROCESSING TEST CHIPS ON A SUBSTRATE TO REVEAL ONE OR MORE POTENTIAL TRANSIENT DEFECTS DURING SUBSEQUENT CONVENTIONAL PROCESSING OF ALL OF THE CHIPS ON THE SUBSTRATE

IDENTIFYING THE EXACT LOCATIONS, ON AN INTEGRATED CIRCUIT CHIP, OF THE ONE OR MORE REVEALED POTENTIAL TRANSIENT DEFECTS ON THE CHIP

FORMING A FILE CORRESPONDING TO THE LOCATIONS OF THE ONE OR MORE POTENTIAL TRANSIENT DEFECTS ON THE CHIP

SENDING THIS FILE TO A METROLOGY APPARATUS TO DETERMINE THE SIZE OF THE ONE OR MORE POTENTIAL TRANSIENT DEFECTS

STOPPING THE PROCESS IF AT LEAST ONE OF THE ONE OR MORE POTENTIAL TRANSIENT DEFECTS EXCEEDS A PREDETERMINED SIZE

U.S. PATENT DOCUMENTS 6,977,183 B1 * 12/2005 DiBiase ......................... 438/7
2002/0114506 A1 8/2002 Hiroi et al. ................. 382/149

OTHER PUBLICATIONS

"High-Resolution Imaging System 2351", KLA-Tencor Product Brochure, © 2002, pp. 1-2.

Ito, "Automated System for LSI Fine Pattern Inspection Based on Comparison on SIM Images and CAD Data", IEEE, pp. 544-549, 1995.

"Klarity Defect: Automated Analysis and Defect Data Management System", KLA-Tencor Product Brochure, © 2002, pp. 1-4.

Kuji, N., et al., "FINDER: A CAD System-Based Electron Beam Tester for Fault Diagnosis of VLSI Circuits," IEEE Transactions on Computer-Aided Design, vol. CAD-5, No. 2, Apr. 1986, pp. 313-319.

* cited by examiner

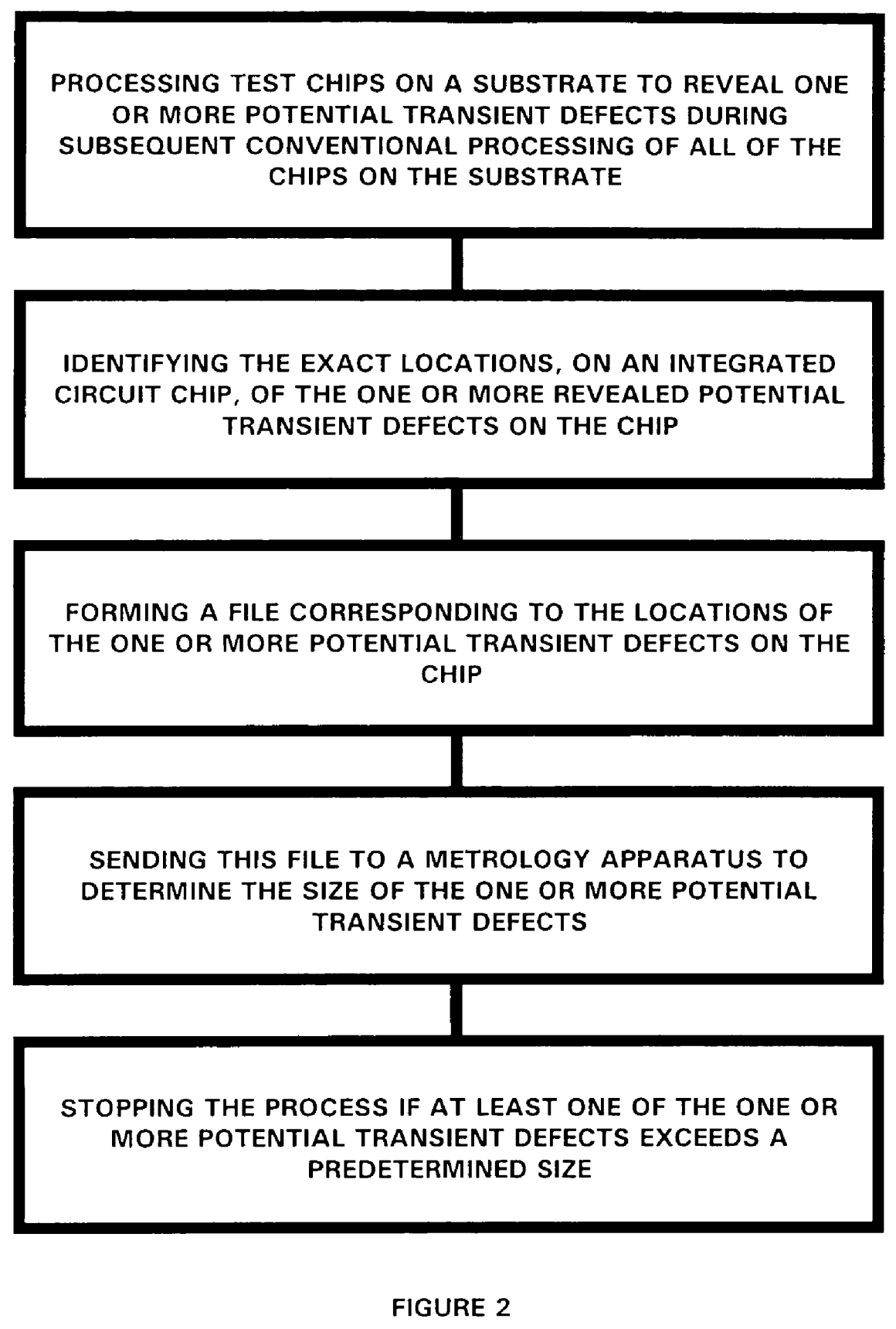

PROCESSING TEST CHIPS ON A SUBSTRATE TO REVEAL ONE OR MORE POTENTIAL TRANSIENT DEFECTS DURING SUBSEQUENT CONVENTIONAL PROCESSING OF ALL OF THE CHIPS ON THE SUBSTRATE

IDENTIFYING THE EXACT LOCATIONS, ON AN INTEGRATED CIRCUIT CHIP, OF THE ONE OR MORE REVEALED POTENTIAL TRANSIENT DEFECTS ON THE CHIP

FORMING A FILE CORRESPONDING TO THE LOCATIONS OF THE ONE OR MORE POTENTIAL TRANSIENT DEFECTS ON THE CHIP

SENDING THIS FILE TO A METROLOGY APPARATUS TO DETERMINE THE SIZE OF THE ONE OR MORE POTENTIAL TRANSIENT DEFECTS

STOPPING THE PROCESS IF AT LEAST ONE OF THE ONE OR MORE POTENTIAL TRANSIENT DEFECTS EXCEEDS A PREDETERMINED SIZE

FIGURE 2

PROCESS FOR LOCATING, DISPLAYING, ANALYZING, AND OPTIONALLY MONITORING POTENTIAL TRANSIENT DEFECT SITES IN ONE OR MORE INTEGRATED CIRCUIT CHIPS OF A SEMICONDUCTOR SUBSTRATE

CROSS-REFERENCE TO PARENT APPLICATION

This application is a division of application Ser. No. 10/199,552 now U.S. Pat. No. 6,977,183 issued on Dec. 20, 2005.

BACKGROUND OF THE INVENTION

1. Field of the Invention

This invention relates, in one embodiment, to a process for identifying the location of potential transient defect sites on an integrated circuit chip on a substrate, where defects are most likely to occur, forming a file containing the locations of such transient defect sites, converting the file into a CAD image layer capable of displaying the location of such potential transient defects, and displaying such potential transient defects as a CAD image layer superimposed over a CAD image of the actual circuit to permit visual inspection of the resulting compound CAD image, and to permit optional action to be taken in view of such potential transient defects. In another embodiment of the invention, the file containing the locations of the potential transient defects is transmitted to a critical dimension (CD) scanning electron microscope (SEM) which monitors the potential transient defect addresses during processing of the chip. The two embodiments of the invention may be practiced in the alternative or in combination with one another.

2. Description of the Related Art

Conventionally, in the formation of integrated circuit chips from a semiconductor substrate such as, for example, a silicon substrate, test patterns have been formed in “scribe” areas on the semiconductor substrate (i.e., the regions where the substrate will be cut or “scribed” into chips). Such test patterns usually include, for example, the finest pattern such as a line which will be used in the formation of the integrated circuit structure, since the formation of such patterns sometimes presents the most challenging areas to lithographically resolve. Actual device components or features such as contacts, vias, gates, etc., have also been identified as sites for critical dimension (CD) locations. However, these locations are not always the most challenging sites to measure due to other factors such as, for example, unforeseen behavior of resolution enhancement treatments wherein the reticle (mask) is deliberately modified to form the desired mask image size in the photoresist layer.

Furthermore, as dimensions of all features in an integrated circuit structure have become smaller and smaller, to a size range where the dimensions of the feature are sometimes smaller than the wavelength of the light used to project the image, it has become more difficult to predict, by planar dimensions (length and width) alone, e.g., by the accuracy of the lithographic reproduction of the width of a thin line, what part of a design will be the most difficult to resolve.

It is known to analyze an integrated circuit chip for the presence of non-repeating defects such as a scratch or a particle, missing portions of a pattern or added pattern. Commercial equipment is available to conduct such inspections of an integrated circuit chip. For example, such commercial integrated circuit inspection equipment is available from KLA-Tencor, the assignee of this invention, under the names, 2351, 2360, and 2370, to identify and provide the location of such defects. However, it is not known to use such commercially available equipment for identification, analysis, and display of sites where defects might occur, i.e., “transient defects”, or for mapping the location of such sites on the chip, or for measuring the critical dimensions of such sites.

It would, therefore, be desirable to provide a process wherein transient defects would be identified, the locations of such transient defects mapped, and the effect of location and size of each of the potential transient defects would be visually displayed and monitored on each chip to determine whether or not measures should be taken to remedy possible occurrence of the transient defect.

SUMMARY OF THE INVENTION

This invention, in its most basic embodiment, comprises a process for: processing one or more test chips on a substrate to reveal one or more potential transient defects during subsequent processing of all of the chips on the substrate; identifying the exact locations of such potential transient defects on one or more chips of a silicon substrate; forming a file containing the coordinates of each such potential transient defect on the chip; converting the file into a CAD image layer capable of displaying locations of such potential transient defects; and displaying such potential transient defects superimposed over a CAD image of the actual circuit to permit visual inspection of the compound CAD image and to permit optional action to be taken in view of such potential transient defects. In another embodiment of the invention, the file containing the locations of the potential transient defects is transmitted to a metrology apparatus such as a critical dimension (CD) scanning electron microscope (SEM) which monitors the potential transient defect addresses during processing of the chip. The two embodiments of the invention may be practiced in the alternative or in combination with one another.

BRIEF DESCRIPTION OF THE DRAWINGS

FIG. 2 is a flowsheet but showing optional steps in another embodiment of the process of the invention.

DETAILED DESCRIPTION OF THE INVENTION

Figure 1:
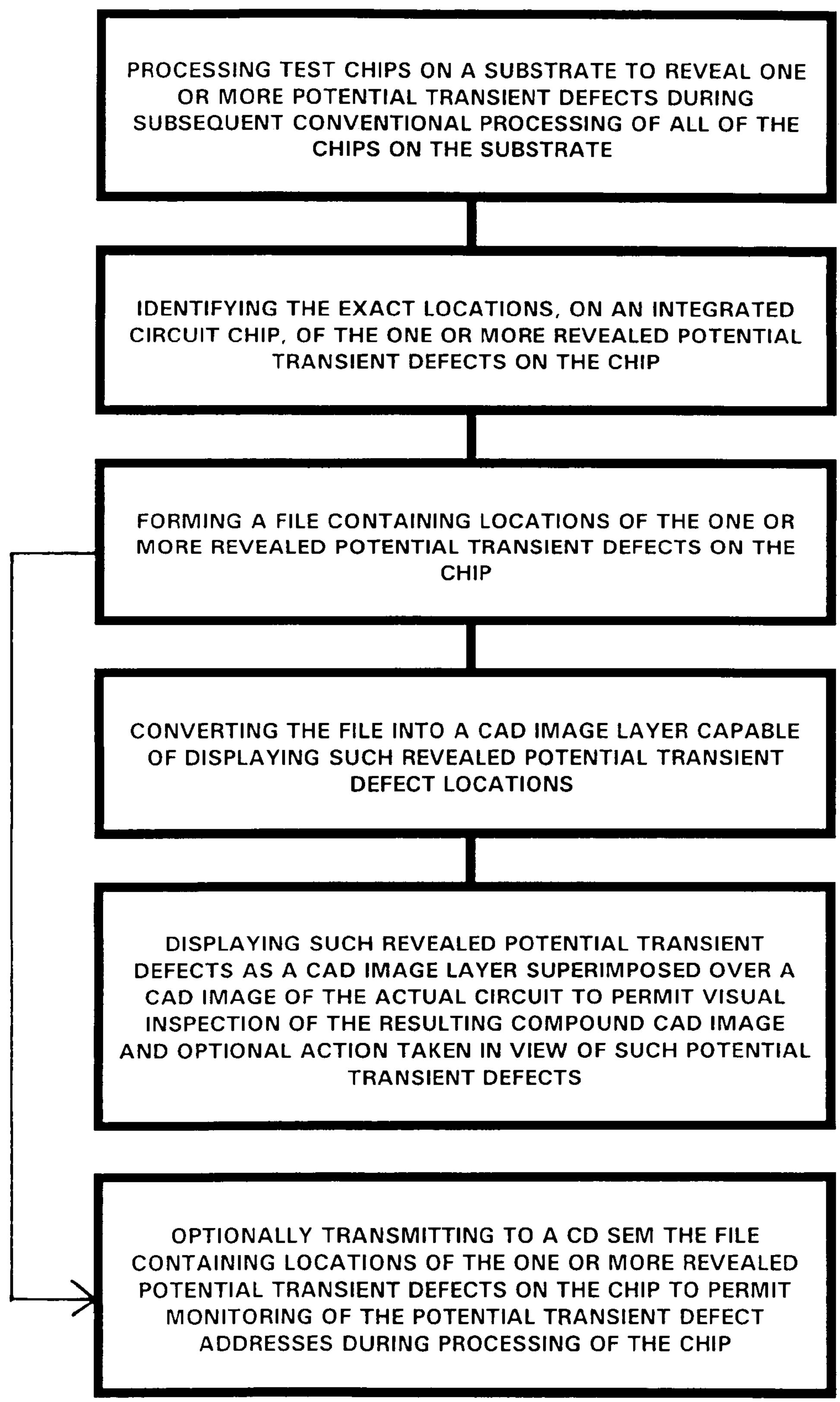
FIG. 1 is a flowsheet illustrating, in its simplest form, the process of the invention.
Figure 3:
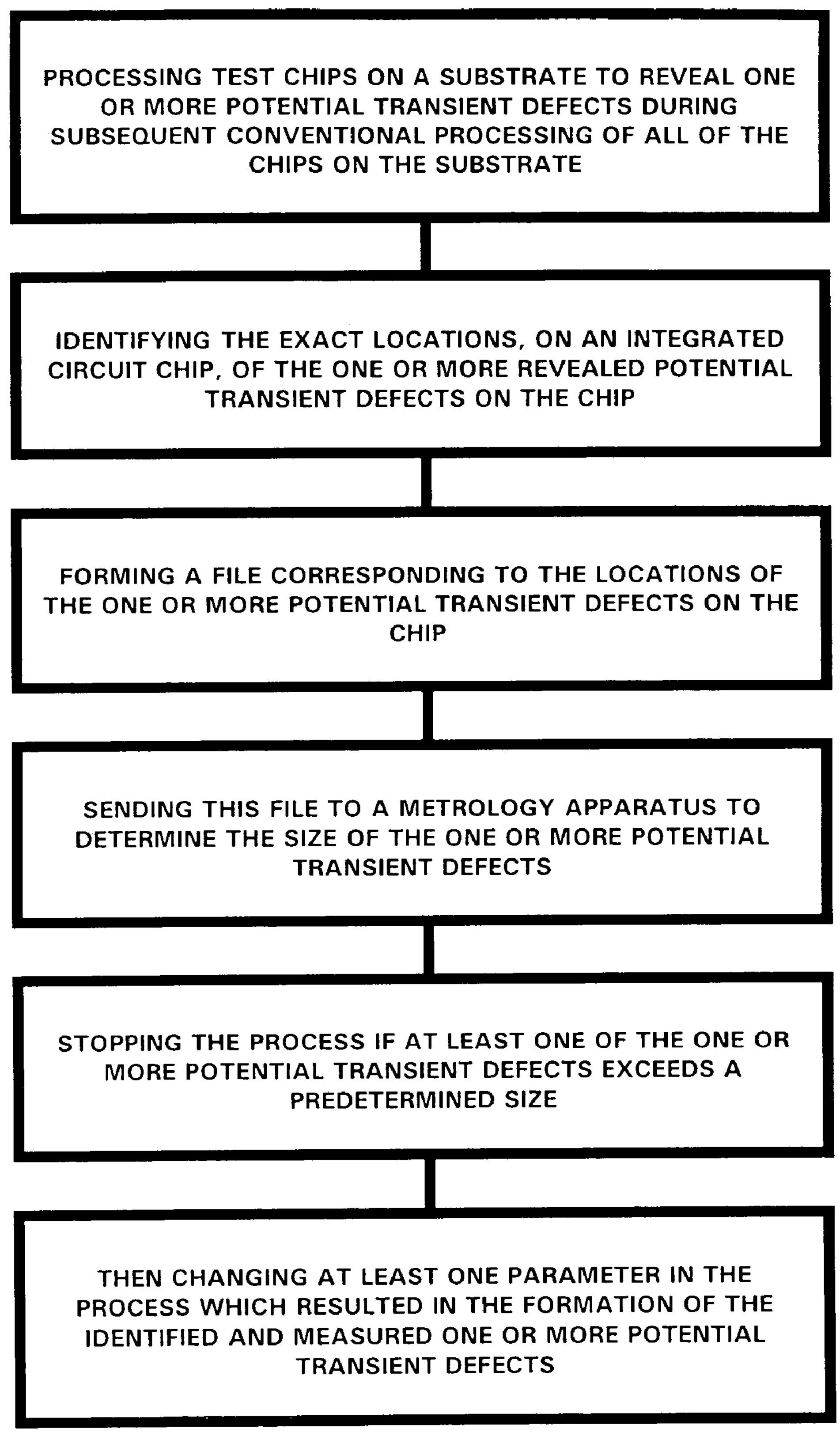
FIG. 3 is a flowsheet similar to the flowsheet of FIG. 2, but showing optional steps of the process of the invention.

The invention, in its most basic embodiment, comprises a process for processing one or more test chips on a substrate to reveal one or more potential transient defects during subsequent processing of all of the chips on the substrate; identifying the exact locations of the one or more revealed potential transient defects on the chip of the silicon substrate; forming a file containing the coordinates of each revealed potential transient defect on the chip; converting the file into a CAD image layer capable of displaying the locations of each revealed potential transient defect; and displaying such revealed potential transient defect locations superimposed over a CAD image of the actual circuit to permit visual inspection of the compound CAD image and to permit optional action to be taken in view of such revealed potential transient defects.

In another embodiment of the invention, the file containing the locations of the revealed potential transient defects is transmitted to a metrology apparatus such as a critical dimension (CD) scanning electron microscope (SEM) which monitors the potential transient defect addresses during processing of the chip. The two embodiments of the invention may be practiced in the alternative or in combination with one another.

The metrology apparatus may be further utilized in carrying out the steps of analyzing the revealed potential transient defects to determine the size of the potential transient defect; changing at least one process parameter at the location of the transient defect site, and; then again analyzing the potential transient defect site to determine whether or not the changed parameter improves the quality of the potential transient defect site. In particular, the step of again analyzing the transient defect site to determine whether or not the changed parameter improves the quality of the potential transient defect site is preferably also carried out using a metrology apparatus such as a CD SEM apparatus.

The term "transient defects", as used herein, is intended to define defects which may be induced on chips on a substrate by changes in the process parameters such as, for example, focus or exposure energy. These potential transient defects may be intentionally induced, then subsequently located using various defect inspection equipment and methodologies. The transient defect coordinates may then be documented (map coordinates of), and routinely measured on the chip as part of the monitoring process. These potential transient defect coordinates may also be superimposed over the original CAD layout so that the original architects/designers, for example, may view the impact of such patterning deviations.

Transient defects may also be the result of marginal mask-making process deviations and scanner lens aberrations, or, more commonly, from incorrect application of resolution enhancement techniques.

The first step comprises varying the modulation parameters, such as focus and exposure time, of some of the chips, e.g., every third chip on a substrate, to reveal one or more potential transient defects which may occur during subsequent conventional processing of all of the chips on the substrate. This is more completely described in U.S. Pat. No. 6,902,855, issued Jun. 7, 2005, entitled "Qualifying Patterns, Patterning Processes, or Patterning Apparatus in the Fabrication of Microlithographic Patterns" assigned to the assignee of this application, and hereby incorporated herein by reference.

The second step comprises identifying the exact locations of each of the one or more revealed potential transient defects on the chips of the substrate. This step may be carried out using commercially available microscopic inspection apparatus such as the previously mentioned 2351, 2360, and 2370, all commercially available from KLA-Tencor, the assignee of this invention.

The third step comprises forming a file containing the coordinates of each transient defect on the chip. This step may be carried out using commercially available software such as KLARITY Defect, an automated in-line yield analysis and defect data management system available from KLA-Tencor, the assignee of this application.

The fourth step of converting the file into a CAD image layer capable of displaying such transient defects; may be carried out using commercially available software. Other software conversion programs may be easily produced, as is well known to those skilled in the art.

The last step of displaying such a CAD image layer of the transient defects superimposed over a CAD image of the actual circuit may be carried out by feeding both images into a CRT to permit remote viewing by persons associated with the process such as a designer or a circuit layout engineer or the like.

The optional step recited in the flowsheet of FIG. 1, as well as in the flowsheets of FIGS. 2–7, of sending the file to a measuring device to determine the size of the one or more transient defects, may comprise sending the file to a metrology device such as a critical dimension (CD) scanning electron microscope (SEM) which will monitor the site or location of the potential transient defect, including the size of the defect when it occurs. The CD SEM then may be programmed to stop the process when such a transient defect exceeds a predetermined size, i.e., when the size of the defect exceeds the tolerance limits of the process.

Figure 4:
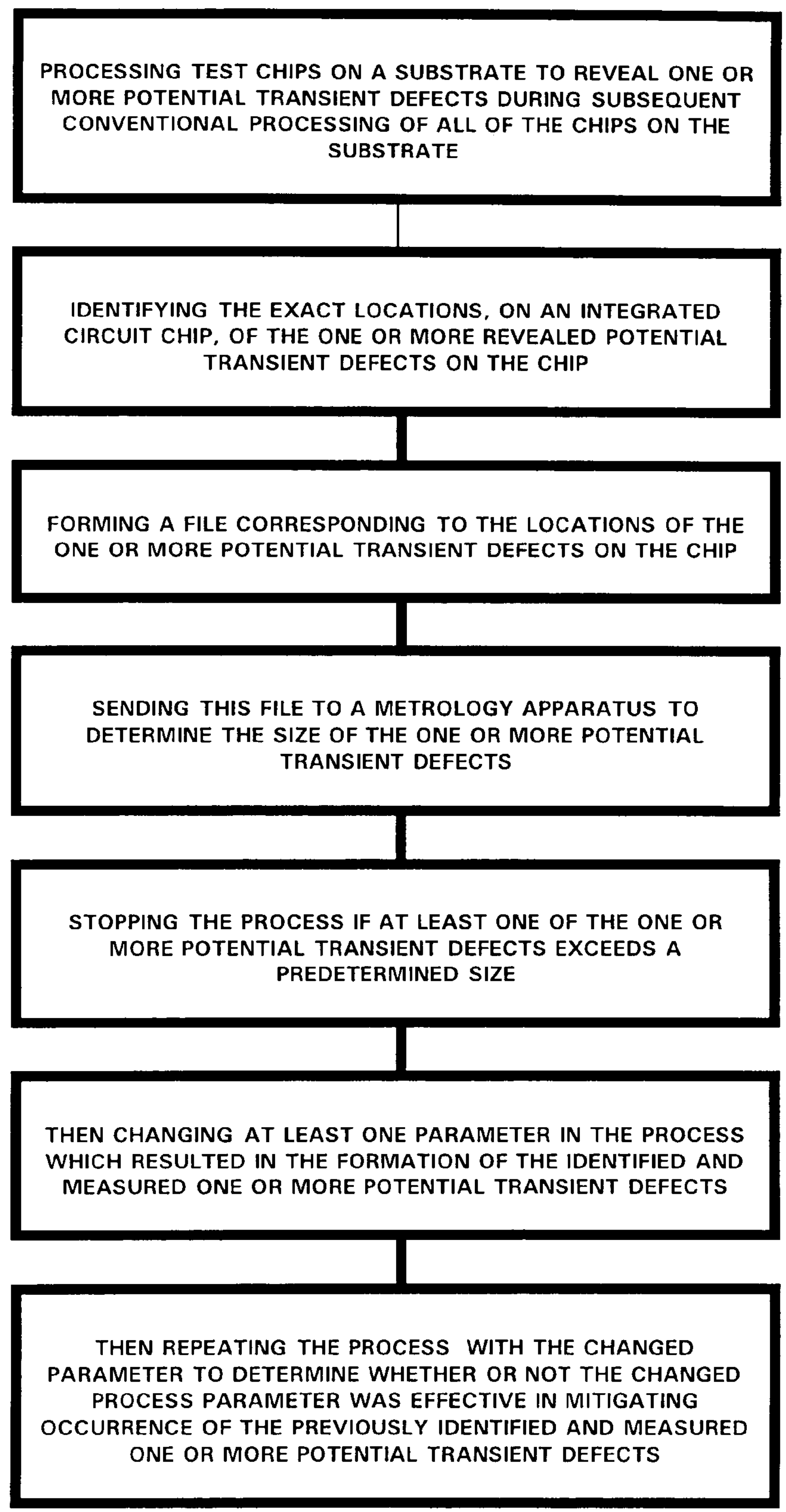
FIG. 4 is a flowsheet similar to the flowsheet of FIG. 3, but showing a further optional step of the process of the invention.
Figure 5:
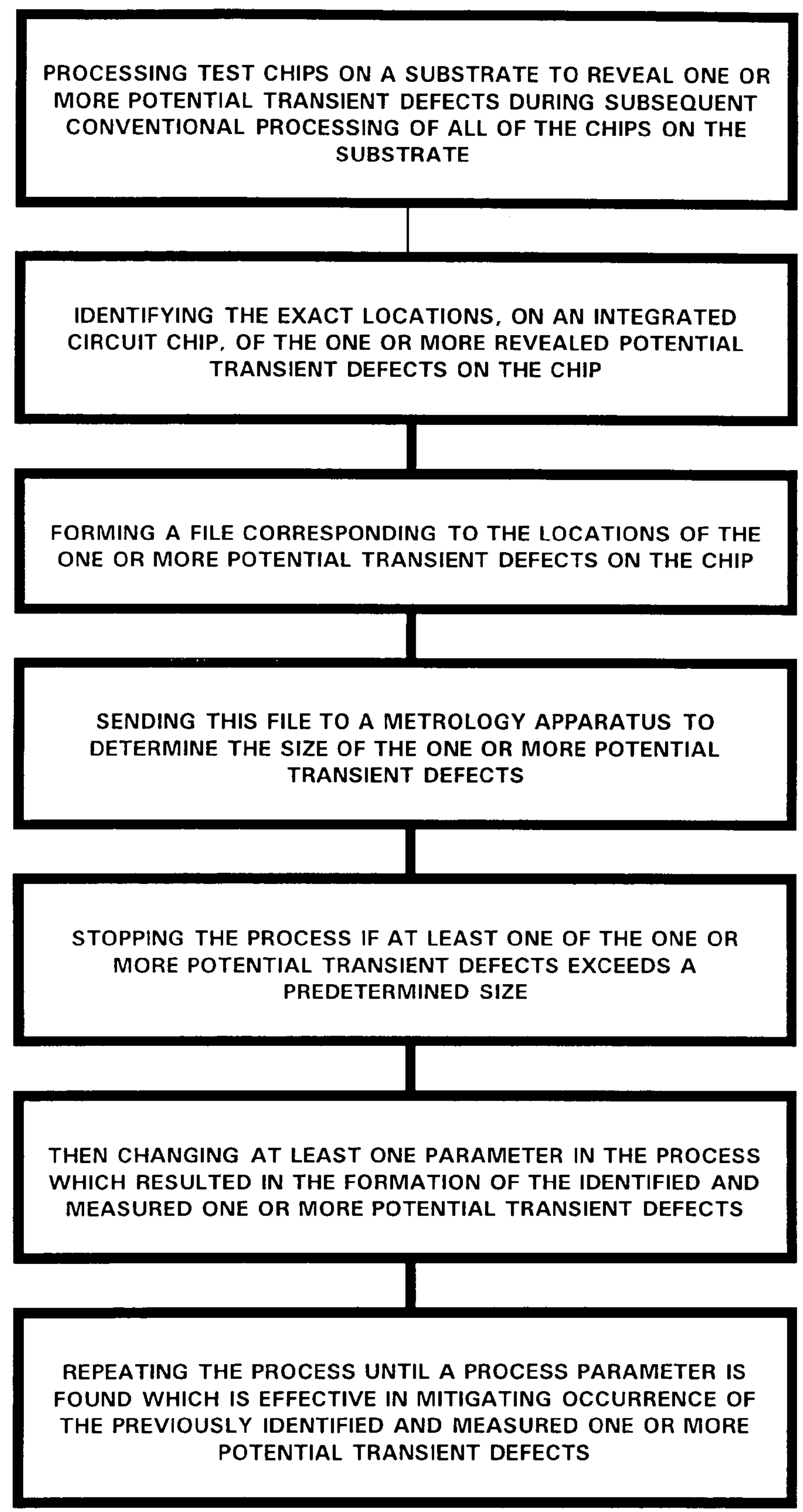
FIG. 5 is also a flowsheet similar to the flowsheet of FIG. 3, but showing yet another optional step of the process of the invention.
Figure 6:
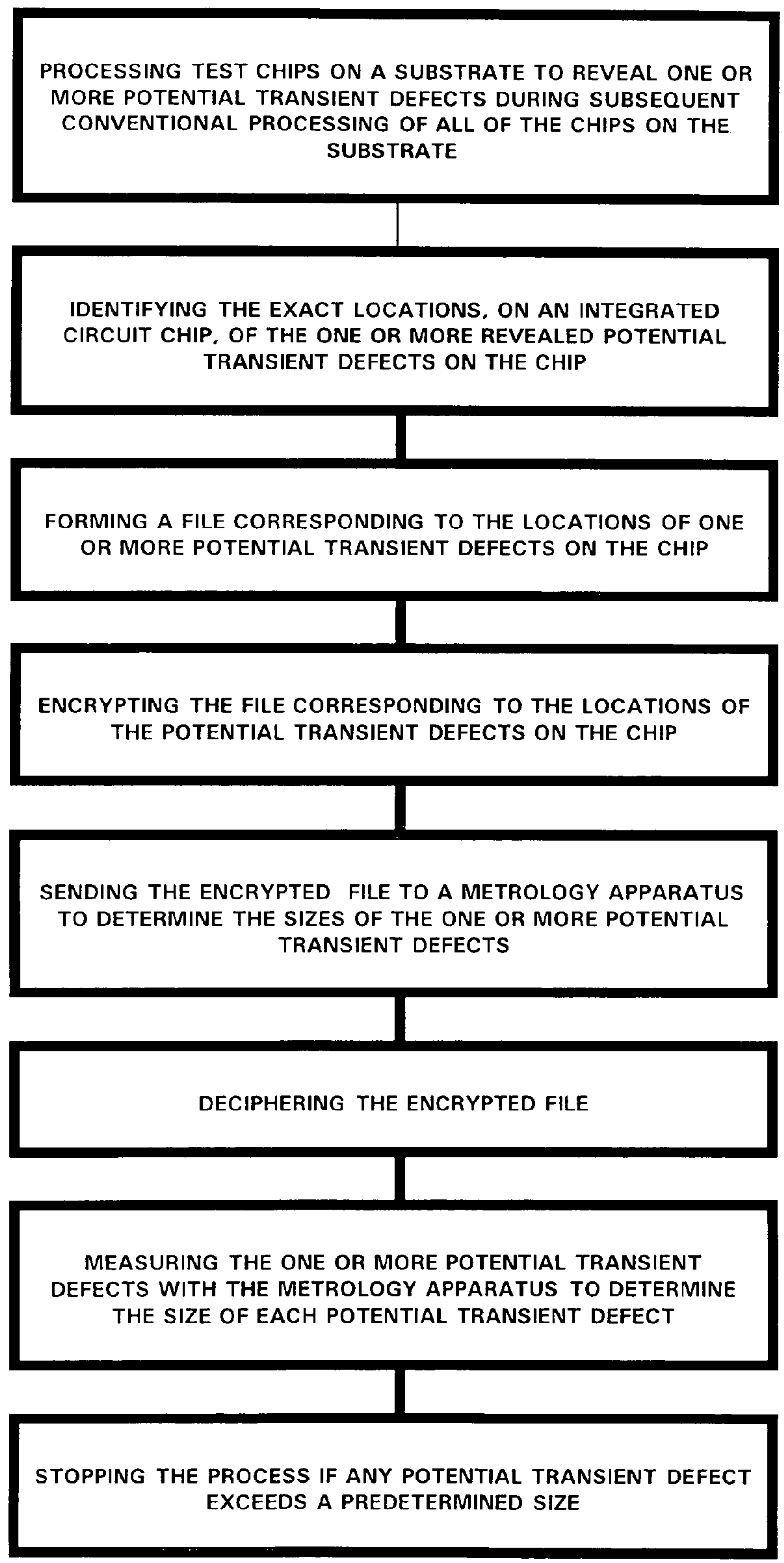
FIG. 6 is a flowsheet showing a modification of the process of the invention.
Figure 7:
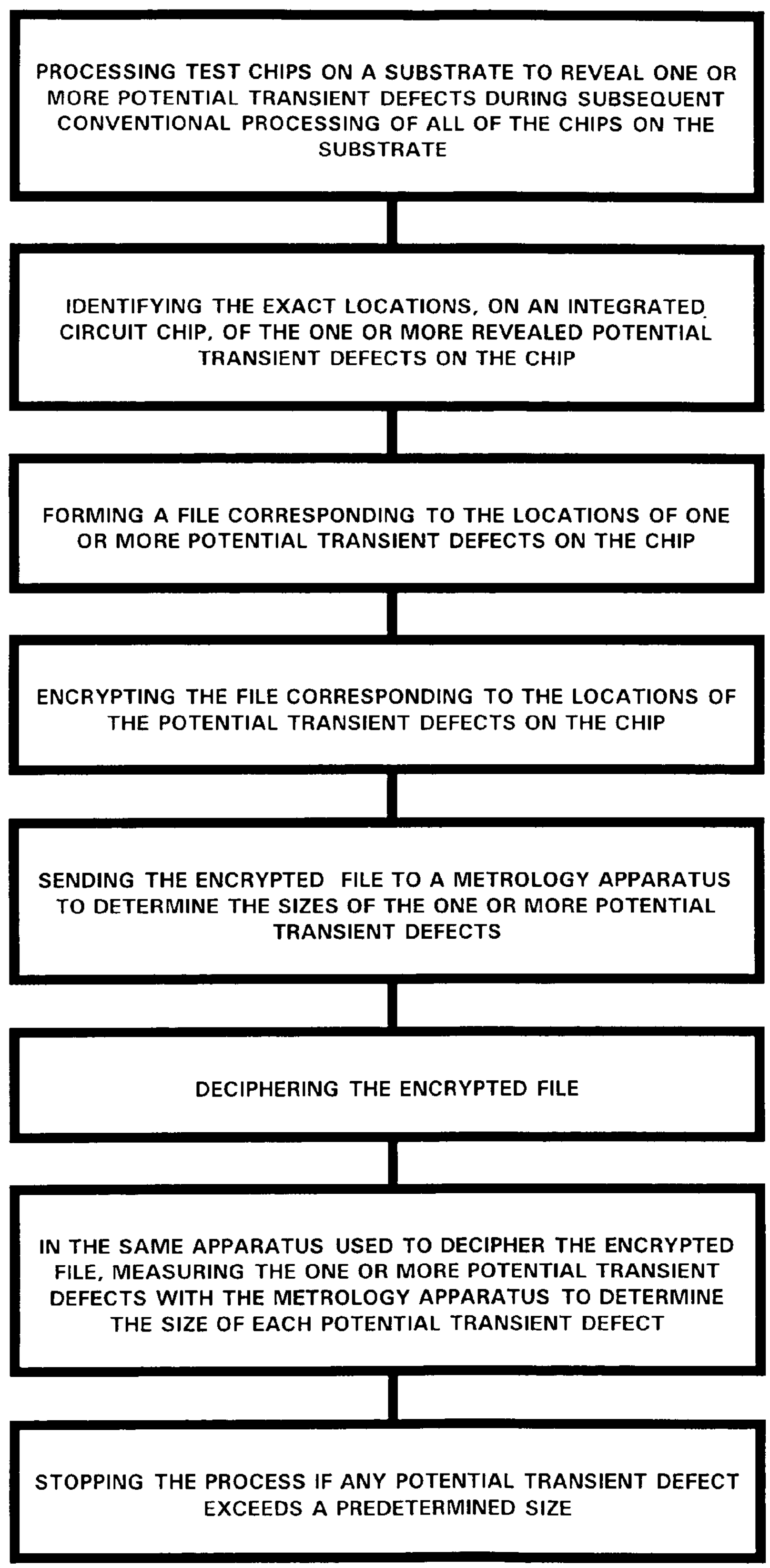
FIG. 7 is a flowsheet showing a further modification of the process shown in FIG. 6.

The CD SEM may also be utilized to change one of the parameters of the manufacturing process, and then to repeat the process with the changed parameter (on another test chip) to analyze the result and to determine, from an analysis of the data, whether or not the changing of the process parameter eliminated, or at least had a positive effect on the defect occurrence being monitored, as recited in the flowsheet of FIG. 4. As recited in the flowsheet of FIG. 5, this change in the process parameters and monitoring of the effect of such a process parameter change, may be repeated until the desired positive change has been achieved. Such adjustments of the process parameters may also be carried out, of course, when the file containing the mapping of the transient defects has been converted to a CAD image which is displayed to appropriate personnel together with the CAD image of the actual circuit being formed on the chip.

To preserve the integrity of the file being formed and transferred from the apparatus used to initially locate the potential transient defect site, the file being sent to the measuring device (the CD SEM), or being converted to a CAD image and sent to a CAD image display station, may be encrypted and then subsequently deciphered at the appropriate station, e.g., at the CAD image display station or at the CD SEM.

Thus, the process of the invention provides for the identification, display, analysis, and optional monitoring of potential transient defects in a chip formed on a semiconductor substrate such as a silicon substrate. Minor process parameter changes may be made and monitored for positive change when occurrence of a transient defect is detected.

Having thus described the invention, what is claimed is:

1. A process for locating and displaying potential transient defects on a chip formed on a silicon substrate which comprises:

a) processing one or more test chips on a substrate to reveal one or more potential transient defects during subsequent processing of all of the chips on the substrate;

b) identifying the exact locations of the one or more revealed potential transient defects on the chip of the silicon substrate;

c) forming a file containing the coordinates of each revealed potential transient defect on the chip; and d) sending said file to a metrology apparatus to determine the size of said one or more potential transient defects.

2. The process of claim 1 wherein said step of sending said file to a metrology apparatus to determine the size of said one or more potential transient defects further comprises sending said file to a critical dimensions (CD) scanning electron microscope (SEM).

3. The process of claim 1 including the further step of slopping the process if at least one of said one or more of said potential transient defects exceeds a predetermined size.

4. The process of claim 3 including the further step, after said stopping step, of changing at least one parameter in the process which resulted in the formation of the identified and measured one or more potential transient defects.

5. The process of claim 4 including the further step of repeating the process, after said step of changing said at least one reaction parameter, to determine whether or not the changed process parameter was effective in mitigating occurrence of the previously identified and measured one or more potential transient defects.

6. The process of claim 5 wherein said step of repeating said process, after said step of changing said at least one reaction parameter, to determine whether or not the changed process parameter was effective in mitigating occurrence of the previously identified and measured one or more potential transient defects is again repeated until a process parameter is found which is effective in mitigating occurrence of the previously identified and measured one or more potential transient defects.

7. A process for locating and displaying potential transient defects on a chip formed on a semiconductor substrate which comprises:

a) processing one or more test chips on a substrate to reveal one or more potential transient defects during subsequent processing of all of the chips on the substrate;

b) identifying the exact locations of the one or more revealed potential transient defects on the chip of the silicon substrate;

c) forming a file containing the coordinates of each revealed potential transient defect on the chip;

d) converting said file into a CAD image layer capable of displaying the locations of each revealed potential transient defect, wherein said step of converting said file into an image whereby optional action can be taken in view of such revealed potential transient defects further comprises sending said file to a metrology device to determine the size of said one or more potential transient defects; and e) displaying said revealed potential transient defect locations superimposed over a CAD image of the actual circuit to permit visual inspection of a compound CAD image and to permit optional action to be taken in view of such revealed potential transient defects.

8. The process of claim 7 including the further step of stopping said process if at least one of said one or more potential transient defects exceeds a predetermined size.

9. The process of claim 7 wherein said step of identifying the exact locations of the one or more revealed potential transient defects on the chip of the silicon substrate is carried out using a microscopic inspection apparatus.

10. A process for locating and displaying potential transient defects on a chip formed on a silicon substrate which comprises:

a) processing one or more test chips on a substrate to reveal one or more potential transient defects during subsequent processing of all of the chips on the substrate;

b) identifying the exact locations of the one or more revealed potential transient defects on the chip of the silicon substrate;

c) forming a file containing the coordinates of each revealed potential transient defect on the chip;

d) encrypting said file containing said coordinates of each revealed potential transient defect on said chip;

e) sending said encrypted file to a metrology apparatus to determine the sizes of the one or more potential transient defects;

f) deciphering said encrypted file after receipt of said encrypted file by said metrology apparatus;

g) converting said file into a CAD image layer capable of displaying the locations of each revealed potential transient defect; and h) displaying such revealed potential transient defect locations superimposed over a CAD image of the actual circuit to permit visual inspection of a compound CAD image and to permit optional action to be taken in view of such revealed potential transient defects.

* * * * *